(12) United States Patent
Yang et al.

(10) Patent No.: US 6,756,806 B1
(45) Date of Patent: Jun. 29, 2004

(54) METHOD OF DETERMINING LOCATION OF GATE OXIDE BREAKDOWN OF MOSFET BY MEASURING CURRENTS

(75) Inventors: Nian Yang, San Jose, CA (US); Zhigang Wang, San Jose, CA (US); Tien-Chun Yang, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 60 days.

(21) Appl. No.: 10/113,017

(22) Filed: Mar. 28, 2002

(51) Int. Cl.[7] .............................................. G01R 31/06
(52) U.S. Cl. ...................................................... 324/769
(58) Field of Search ................................ 324/763–769, 324/158.1, 73.1; 438/14–18

(56) References Cited

U.S. PATENT DOCUMENTS

| | | | | |
|---|---|---|---|---|
| 5,594,349 A | * | 1/1997 | Kimura | 324/551 |
| 6,049,213 A | * | 4/2000 | Abadeer | 324/719 |
| 6,326,792 B1 | * | 12/2001 | Okada | 324/456 |

\* cited by examiner

Primary Examiner—Vinh P. Nguyen

(57) ABSTRACT

A method of determining the location of the breakdown in the gate oxide of a MOSFET is disclosed. Additionally, the method determines the location of the breakdown in a manner that is convenient to use and can be easily employed. The method will determine whether there is a breakdown in the gate oxide. If there is a breakdown, the method will enable determination of the location of the breakdown in the gate oxide.

33 Claims, 7 Drawing Sheets

METHOD OF DETERMINING LOCATION OF GATE OXIDE BREAKDOWN OF MOSFET BY MEASURING CURRENTS

BACKGROUND OF THE INVENTION

1. Field of the Invention

The present invention generally relates to MOSFETS (metal oxide semiconductor field effect transistors). More particularly, the present invention relates to the field of determining location of the breakdown in a gate oxide of a MOSFET.

2. Related Art

Tremendous advances have been made in the development of metal oxide semiconductor field effect transistor (MOSFET) device. This progress has made it possible to incorporate MOSFET devices into a wider range of industrial and consumer applications. The n-type MOSFET (or NMOSFET) is formed on a p-type substrate. The p-type MOSFET (or PMOSFET) is formed on an n-type substrate. One particular development has been the dramatic reduction (or scaling) of the dimensions of a MOSFET device during the past decades, such scaling continues today. In particular, as the scaling of MOSFET devices used in VLSI (Very Large Scale Integration) chips continues, the thickness of the gate oxide of the MOSFET approaches a range of several nanometers or several sub-nanometers. For example, some state-of-the-art high-volume fabrication MOSFET devices are employing gate oxides having a thickness in the range of approximately 1.5–3 nm (nanometers). The gate oxide thickness is one of the most critical parameters of the MOSFET device.

As the thickness of the gate oxide becomes ultra thin, the dielectric breakdown (or breakdown) in the gate oxide of the MOSFET device and the reliability of the gate oxide are urgent issues needing review and analysis. The breakdown of the gate oxide becomes a major concern since the reliability of the MOSFET device (as well as circuits and products incorporating the MOSFET device) is dependent on the performance of the gate oxide. Generally, the gate oxide layer functions as an electrical insulating layer (or dielectric layer) between a gate node of the MOSFET and a substrate layer of the MOSFET. In the case of a breakdown, the insulating property of the gate oxide fails at one or more locations in the gate oxide between the gate node and the substrate layer. Under certain conditions, the MOSFET device will still function normally (with reduced performance) despite the breakdown in the gate oxide. On other occasions, the breakdown in the gate oxide causes a fatal failure in the MOSFET device, preventing it from operating properly.

Therefore, a detailed analysis of the breakdown of the gate oxide that includes determining the breakdown locations in these scaled MOSFET devices can help evaluate the performance, predict the lifetime, and improve the design of VLSI chips (as well as circuits and products incorporating the MOSFET devices). Though, lots of efforts have been made to analyze the breakdown of the oxide in large MOS (metal oxide semiconductor) capacitors, it is still difficult to locate the breakdown in the gate oxide within the scaled MOSFET devices.

What is needed is a method of determining the location of the breakdown in the gate oxide of a MOSFET. Moreover, what is needed is a method for determining the location of the breakdown that is convenient to use and can be easily employed.

SUMMARY OF THE INVENTION

A method of determining the location of the breakdown in the gate oxide of a MOSFET is disclosed. Additionally, the present invention determines the location of the breakdown in a manner that is convenient to use and can be easily employed.

According to one embodiment of the method of determining the location of the breakdown in the gate oxide of a MOSFET, a MOSFET having the gate oxide is prepared for data measurements. The method is applicable to both NMOSFETs and PMOSFETs. The method will determine whether there is a breakdown in the gate oxide. If there is a breakdown, the method will enable determination of the location of the breakdown in the gate oxide. Next, the MOSFET is configured according to a first measurement set-up. In the case of an NMOSFET, the source node of the NMOSFET is coupled to a ground, while the drain node of the NMOSFET is coupled to a first voltage. Then, a range of voltages is applied at the gate node of the MOSFET. For each applied voltage, a first set of currents is measured, whereas the first set of currents include a gate current, a source current, and a drain current. Continuing, the location of the breakdown of the gate oxide of the MOSFET is determined using the measured first set of currents. The measured first set of currents indicates whether there is a breakdown in the gate oxide. Moreover, the measured first set of currents indicates whether the breakdown is located in a channel portion of the gate oxide, in a source node overlap portion of the gate oxide, or in a drain node overlap portion of the gate oxide.

Moreover, the result of the first measurement set-up can be confirmed using a second measurement set-up. In the second measurement set-up, the source node of the MOSFET is designated as the new drain node, while the drain node of the MOSFET is designated as the new source node. In the case of the NMOSFET, the new source node is couple to the ground, while the new drain node is coupled to the first voltage. Then, a second range of voltages is applied at the gate node of the MOSFET. For each applied voltage, a second set of currents is measured, whereas the second set of currents include a gate current, a source current measured at the new source node, and a drain current measured at the new drain node. Continuing, the location of the breakdown of the gate oxide of the MOSFET is determined using the measured first set of currents and the measured second set of currents.

These and other advantages of the present invention will no doubt become apparent to those of ordinary skill in the art after having read the following detailed description of the preferred embodiments, which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the present invention.

The drawings referred to in this description should not be understood as being drawn to scale except if specifically noted.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

A method of determining the location of the breakdown in the gate oxide of a MOSFET is disclosed herein. Additionally, the present invention determines the location of the breakdown in a manner that is convenient to use and can be easily employed. Although the description of the present invention will focus on determining the breakdown in the gate oxide of an NMOSFET, the method of the present invention is equally applicable to determining the breakdown in the gate oxide of a PMOSFET. It should be understood that the term "gate oxide" refers to silicon dioxide, silicon oxynitride, or any other high-k dielectric used in MOSFET fabrication.

Figure 1:
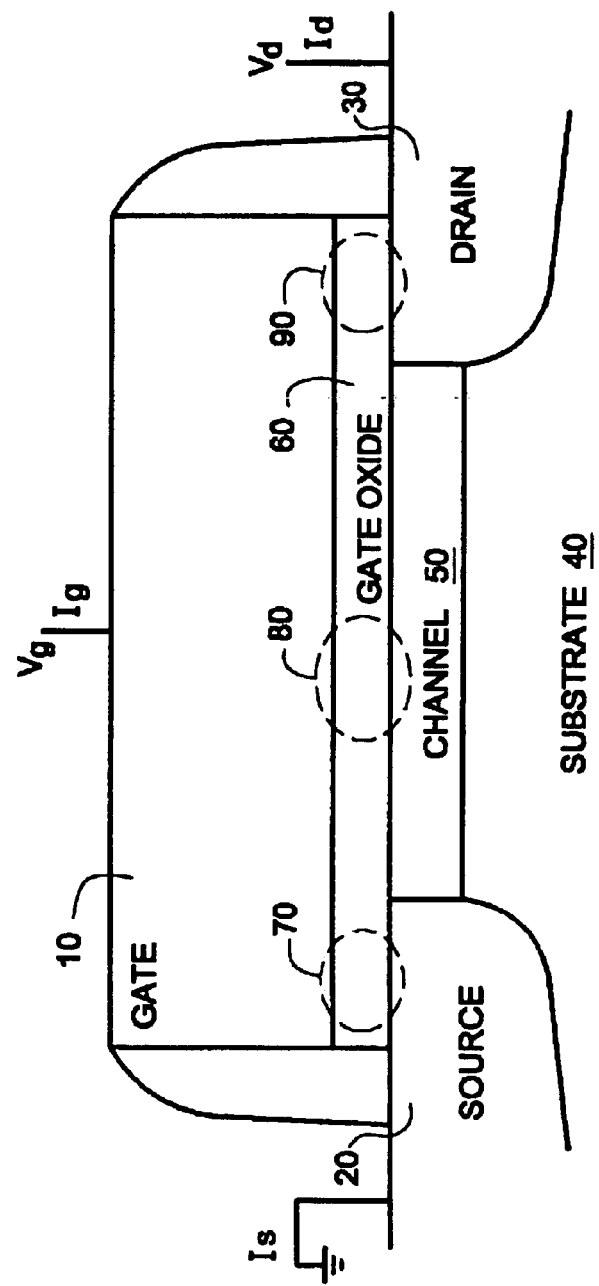
FIG. 1 illustrates an exemplary NMOSFET device, showing a first measurement setup in accordance with an embodiment of the present invention.

FIG. 1 illustrates an exemplary NMOSFET device 100, showing a first measurement setup in accordance with an embodiment of the present invention. The exemplary NMOSFET device 100 includes a p-type substrate 40, a heavily n-type doped drain node 30, a heavily n type doped source node 20, a gate oxide 60 typically comprised of silicon dioxide, and a gate node 10 typically comprised of n-type doped polysilicon. Under normal operation, a channel 50 is formed between the source node 20 and the drain node 30 to conduct current.

The exemplary NMOSFET device 100 represents the most widely used and well-defined transistor in practice. The exemplary NMOSFET device 100 may have any dimensions (e.g., the gate oxide thickness is no less than approximately 3 nanometers, the gate oxide thickness is no greater than approximately 3 nanometers). The method of determining location of the breakdown in the gate oxide is well suited for locating the breakdown in the gate oxide of scaled (or small) MOSFET devices, unlike prior techniques that concentrated on analyzing the breakdown of gate oxides by using large MOS capacitors. Moreover, in an embodiment of the present invention, breakdown information and gate oxide reliability information is gathered from MOSFETS that are scaled for real circuit applications.

As will be described below, a range of gate voltages $V_g$ will be applied to the gate node 10 and various currents (e.g., a gate current $I_g$, a drain current $I_d$, and a source current $I_s$) will be measured as a function of the applied gate voltage $V_g$, whereas the various measured currents will indicate whether there is a breakdown in the gate oxide 60. If there is a breakdown in the gate oxide 60, the various measured currents will indicate the location of the breakdown in the gate oxide 60. The breakdown in the gate oxide 60 can be located in a source node overlap portion 70 of the gate oxide 60, in a drain node overlap portion 90 of the gate oxide 60, or in a channel portion 80 of the gate oxide 60.

Continuing with FIG. 1, according to one embodiment of the method of determining the location of the breakdown in the gate oxide 60 of the NMOSFET device 100, the NMOSFET device 100 is prepared for data measurements. The method determines whether there is a breakdown in the gate oxide 60. If there is a breakdown, the method enables determination of the location of the breakdown in the gate oxide 60. Typically, the breakdown in the gate oxide 60 is caused by stress, age, fabrication defect, improper operation, or degradation. Usually, a large increase in the gate current $I_g$ indicates a possible problem with the gate oxide of the NMOSFET device 100.

As illustrated in FIG. 1, the NMOSFET device 100 is configured according to a first measurement set-up. In the case of the NMOSFET device 100, in the first measurement set-up the source node 20 of the NMOSFET device 100 is coupled to a ground, while the drain node 30 of the NMOSFET device 100 is coupled to a first voltage, such as 1.5 V. Thus, the drain voltage $V_{ds}$ is 1.5 V.

After NMOSFET device 100 is configured according to the first measurement set-up, a range of gate voltages $V_g$ is applied at the gate node 10 of the NMOSFET device 100. The range of gate voltages $V_g$ includes negative voltages and positive voltages. For each applied gate voltage $V_g$, a first set of currents is measured, whereas the first set of currents include a gate current $I_g$, a source current $I_s$, and a drain current $I_d$. Any type of device for measuring current can be employed. The gate current $I_g$ is measured at the gate node 10. The source current $i_g$ is measured at the source node 20. The drain current $I_d$ is measured at the drain node 30.

Moreover, the location (e.g., in a source node overlap portion 70 of the gate oxide 60, in a drain node overlap portion 90 of the gate oxide 60, or in a channel portion 80 of the gate oxide 60) of the breakdown of the gate oxide 60 of the NMOSFET device 100 is determined using the measured first set of currents (i.e., the gate current $I_g$, the drain current $I_d$ and the source current $I_s$). In particular, the gate current $I_g$ data is plotted as a function of the gate voltage $V_g$. The drain current $I_d$ data is plotted as a function of the gate voltage $V_g$. The source current $I_s$ data is plotted as a function of the gate voltage $V_g$. The plots (see FIGS. 2B–2D) of the measured first set of currents indicate whether there is a breakdown in the gate oxide 60. Moreover, the plots (see FIGS. 2B–2D) of the measured first set of currents indicate whether the breakdown is located in a channel portion 80 of the gate oxide 60, in a source node overlap portion 70 of the gate oxide 60, or in a drain node overlap portion 90 of the gate oxide 60.

Figure 2A:
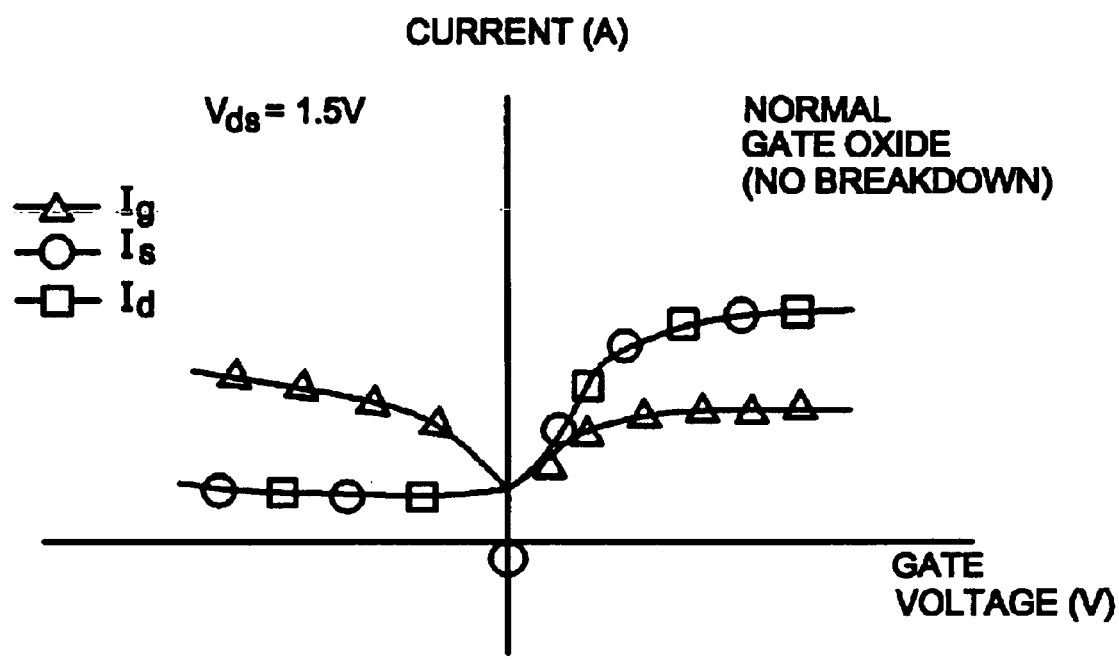
FIGS. 2A–2D illustrate graphs showing curves of the gate current, the drain current, and the source current that indicate the location of the breakdown in a gate oxide of the NMOSFET of FIG. 1 in accordance with an embodiment of the present invention.

FIGS. 2A–2D illustrate graphs showing curves of the gate current $I_g$ data, the drain current $I_d$ data, and the source current $I_s$ data that indicate the location of the breakdown in the gate oxide 60 of the NMOSFET device 100 of FIG. 1 in accordance with an embodiment of the present invention FIG. 2A illustrates a graph showing curves of normal gate current $I_g$ data, normal drain current $I_d$ data, and normal source current $I_s$ data as a function of the gate voltage $V_g$ when there is no breakdown in the gate oxide 60 of the NMOSFET device 100 of FIG. 1. Thus, the gate oxide 60 is functioning normally. The drain voltage $V_{ds}$ is 1.5 V. As illustrated in FIG. 2A, the normal drain current $I_d$ and the normal source current $I_s$ are substantially equal for negative and positive gate voltages $V_g$. It should be understood that the curves will vary if the dimensions of the NMOSFET device 100 are changed or if the voltages applied to the NMOSFET device 100 are changed.

Figure 2B:
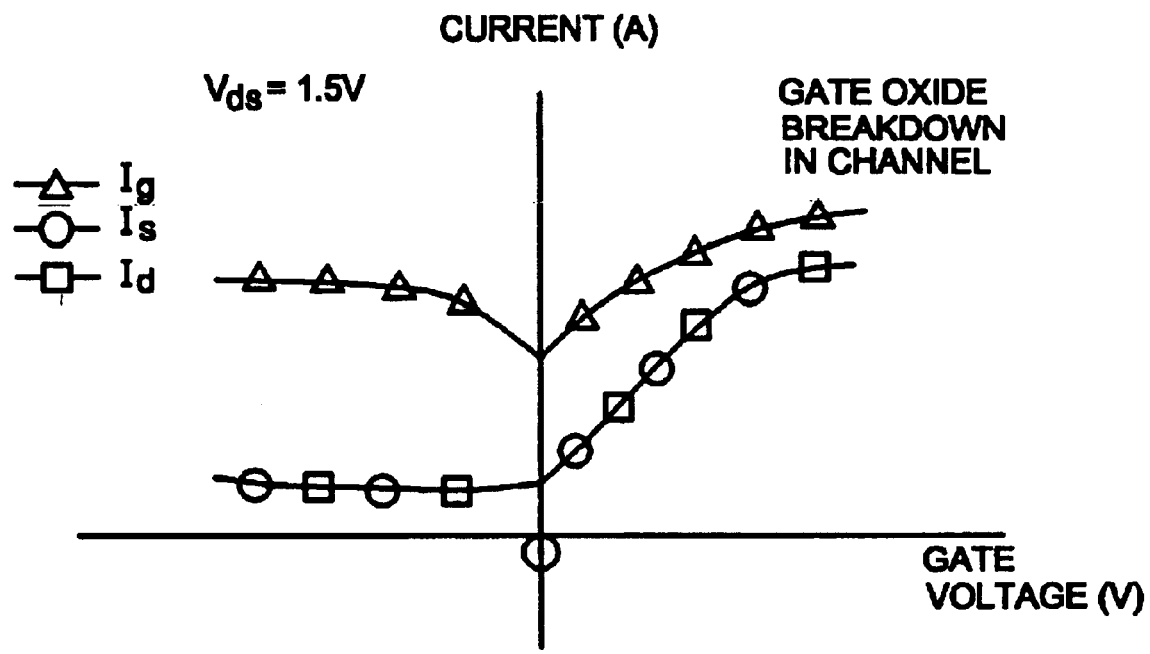

FIG. 2B illustrates a graph showing curves of measured gate current $I_g$ data, measured drain current $I_d$ data, and measured source current $I_s$ data as a function of the gate voltage $V_g$ when there is a breakdown in the gate oxide 60 of the NMOSFET device 100 of FIG. 1. In particular, the breakdown is located in the channel portion 80 of the gate oxide 60. Thus, the gate oxide 60 is not functioning normally. The drain voltage $V_{ds}$ is 1.5 V. The measured gate current $I_g$ of FIG. 2B is larger relative to the normal gate current $I_g$ of FIG. 2A at applied negative and positive gate voltages $V_g$. Moreover, the measured drain current $I_d$ and the measured source current $I_s$ of FIG. 2B remain approximately unchanged relative to the normal drain current $I_d$ and the normal source current $I_s$ of FIG. 2A at applied negative and positive gate voltages $V_g$. Typically, the NMOSFET device 100 will still function normally (with reduced performance and with higher power consumption) despite the breakdown in the channel portion 80 of the gate oxide 60. It should be understood that the curves will vary if the dimensions of the NMOSFET device 100 are changed or if the voltages applied to the NMOSFET device 100 are changed.

Figure 2C:
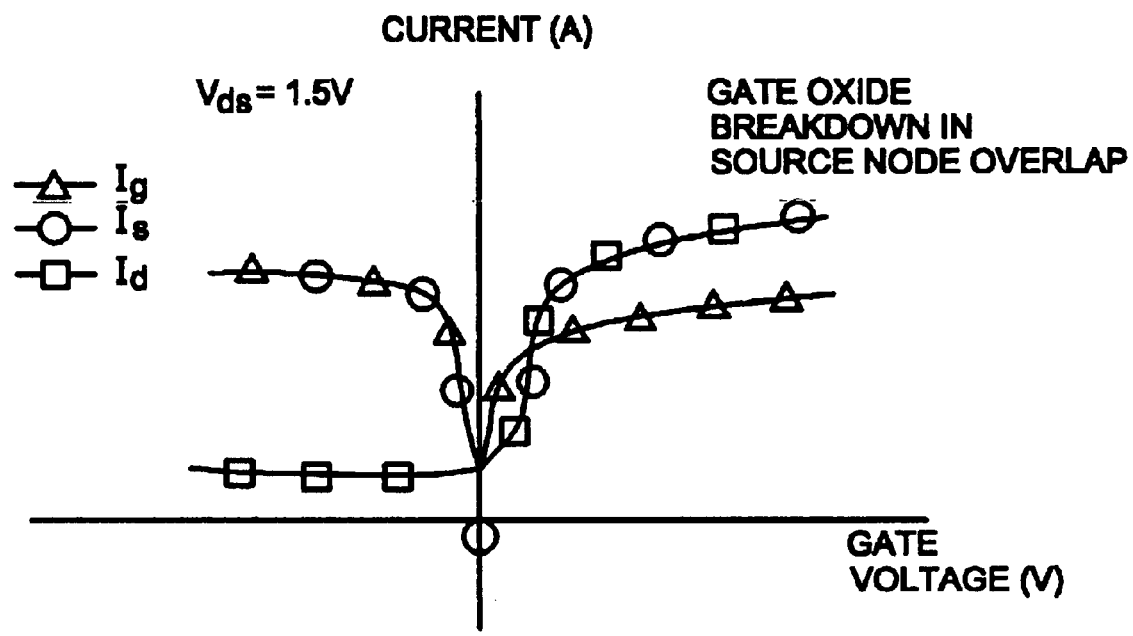

FIG. 2C illustrates a graph showing curves of measured gate current $I_g$ data, measured drain current $I_d$ data, and measured source current $I_s$ data as a function of the gate voltage $V_g$ when there is a breakdown in the gate oxide 60 of the NMOSFET device 100 of FIG. 1. In particular, the breakdown is located in the source node overlap portion 70 of the gate oxide 60. Thus, the gate oxide 60 is not functioning normally. The drain voltage $V_{ds}$ is 1.5 V. The measured source current $I_s$ of FIG. 2C is larger relative to the normal source current $I_s$ of FIG. 2A at applied negative gate voltages $V_g$. Moreover, the measured gate current $I_g$ and the measured source current $I_s$ of FIG. 2C are substantially equal at applied negative gate voltages $V_g$. Typically, the NMOSFET device 100 will still function normally (with reduced performance and with higher power consumption) despite the breakdown in the source node overlap portion 70 of the gate oxide 60 because the drain current $I_d$ remains approximately normal in a typical circuit application incorporating the NMOSFET device 100 where the gate voltage $V_g$ is either at zero volts or positive with respect to the source node 20, limiting the leakage current (see FIG. 2C). It should be understood that the curves will vary if the dimensions of the NMOSFET device 100 are changed or if the voltages applied to the NMOSFET device 100 are changed.

Figure 2D:
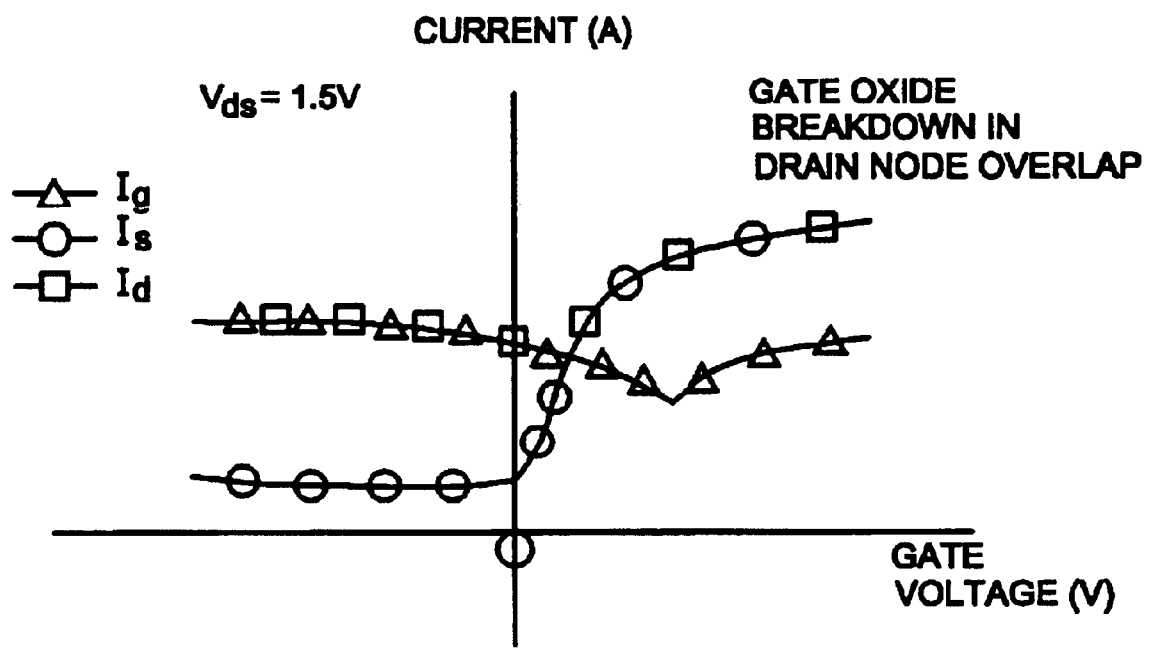

FIG. 2D illustrates a graph showing curves of measured gate current $I_g$ data, measured drain current $I_d$ data, and measured source current $I_s$ data as a function of the gate voltage $V_g$ when there is a breakdown in the gate oxide 60 of the NMOSFET device 100 of FIG. 1. In particular, the breakdown is located in the drain node overlap portion 90 of the gate oxide 60. Thus, the gate oxide 60 is not functioning normally. The drain voltage $V_{ds}$ is 1.5 V. The measured drain current $I_d$ of FIG. 2D is larger relative to the normal drain current $I_d$ of FIG. 2A at applied negative gate voltages $V_g$. Moreover, the measured gate current $I_g$ and the measured drain current $I_d$ of FIG. 2D are substantially equal at applied negative gate voltages $V_g$. Typically, the breakdown in the drain node overlap portion 90 of the gate oxide 60 causes a fatal failure in the NMOSFET device 100, preventing it from operating properly because even at gate voltage $V_g$=0 volts the drain current $I_d$ is not a very low value (ideally, approaching zero). This causes a large leakage current in the NMOSFET device 100 and, in turn, in circuits incorporating the NMOSFET device 100 (see FIG. 2D). It should be understood that the curves will vary if the dimensions of the NMOSFET device 100 are changed or if the voltages applied to the NMOSFET device 100 are changed.

Figure 3:
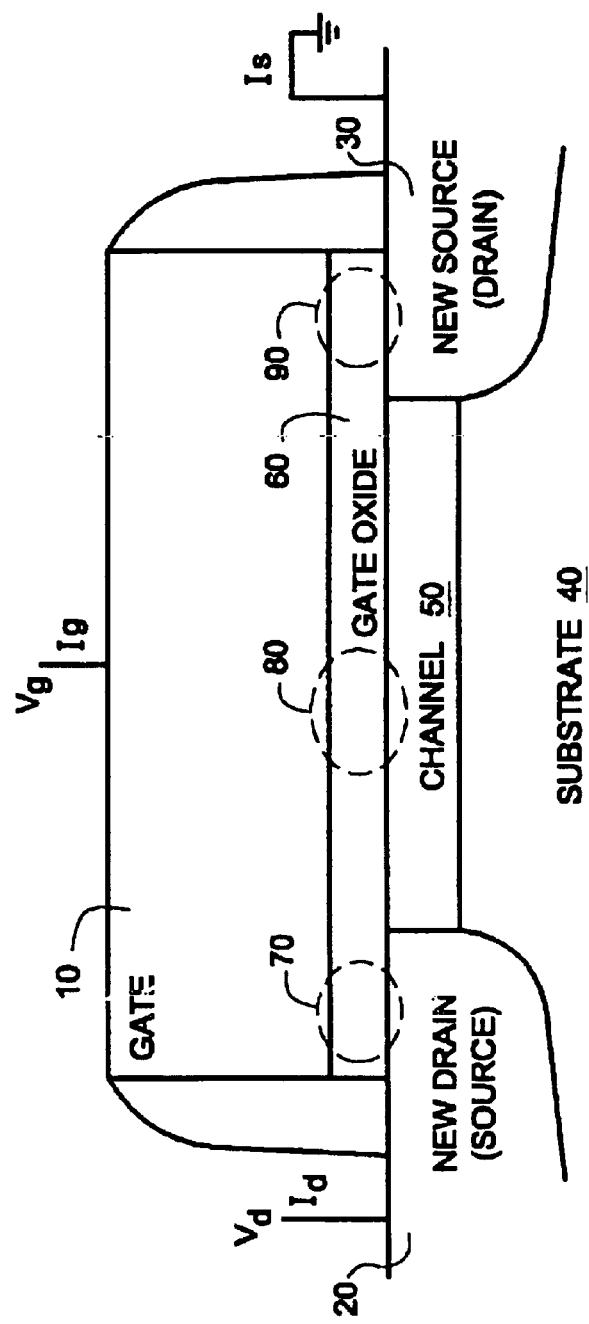
FIG. 3 illustrates the exemplary NMOSFET device of FIG. 1, showing a second measurement setup in accordance with an embodiment of the present invention.

FIG. 3 illustrates the exemplary NMOSFET device 100 of FIG. 1, showing a second measurement setup in accordance with an embodiment of the present invention. The result (i.e., location of the breakdown in a channel portion 80 of the gate oxide 60, in a source node overlap portion 70 of the gate oxide 60, or in a drain node overlap portion 90 of the gate oxide 60) of the first measurement set-up can be confirmed using the second measurement set-up illustrated in FIG. 3.

As illustrated in FIG. 3, the NMOSFET device 100 is configured according to a second measurement set-up. In the second measurement set-up, the source node 20 of the NMOSFET device 100 is designated as the new drain node 20, while the drain node 30 of the NMOSFET device 100 is designated as the new source node 30. In the case of the NMOSFET, the new source node 30 is couple to the ground, while the new drain node 20 is coupled to the first voltage, such as 1.5 V. Thus, the drain voltage $V_{ds}$ is 1.5 V. Moreover, the new drain node overlap portion 70 of FIG. 3 corresponds to the source node overlap portion 70 of FIG. 1. In addition, the new source node overlap portion 90 of FIG. 3 corresponds to the drain node overlap portion 90 of FIG. 1.

After NMOSFET device 100 is configured according to the second measurement set-up, a second range of gate voltages $V_g$ is applied at the gate node 10 of the NMOSFET device 100. The second range of gate voltages $V_g$ includes negative voltages and positive voltages. For each applied gate voltage $V_g$, a second set of currents is measured, whereas the second set of currents include a gate current $I_g$, a source current $L_g$ measured at the new source node 30, and a drain current $I_d$ measured at the new drain node 20. Any type of device for measuring current can be employed.

Again, the location (e.g., in a source node overlap portion 70 of the gate oxide 60, in a drain node overlap portion 90 of the gate oxide 60, or in a channel portion 80 of the gate oxide 60 of FIG. 1) of the breakdown of the gate oxide 60 of the NMOSFET device 100 is determined using the measured first set of currents (i.e., the gate current $I_g$, the drain current $I_d$, and the source current $I_s$) and the measured second set of currents (i.e., the gate current $I_g$, the drain current $I_d$ measured at the new drain node 20 of FIG. 3, and the source current $I_s$ measured at the new source node 30 of FIG. 3). If the measured first set of currents indicate that the breakdown is located in a channel portion 80 of the gate oxide 60 as illustrated in FIG. 2B, the measured second set of currents should also indicate that the breakdown is located in a channel portion 80 of the gate oxide 60 as illustrated in FIG. 2B.

Moreover, if the measured first set of currents indicate that the breakdown is located in a source node overlap portion 70 (FIG. 1) of the gate oxide 60 as illustrated in FIG. 2C, the measured second set of currents should indicate that the breakdown is located in the new drain node overlap portion 70 (FIG. 3) of the gate oxide 60 as illustrated in FIG. 2D, whereas the source node overlap portion 70 (FIG. 1) corresponds to the new drain node overlap portion 70 (FIG. 3).

In addition, if the measured first set of currents indicate that the breakdown is located in a drain node overlap portion 90 (FIG. 1) of the gate oxide 60 as illustrated in FIG. 2D, the measured second set of currents should indicate that the breakdown is located in the new source node overlap portion 90 (FIG. 3) of the gate oxide 60 as illustrated in FIG. 2C, whereas the drain node overlap portion 90 (FIG. 1) corresponds to the new source node overlap portion 90 (FIG. 3).

Figure 4:
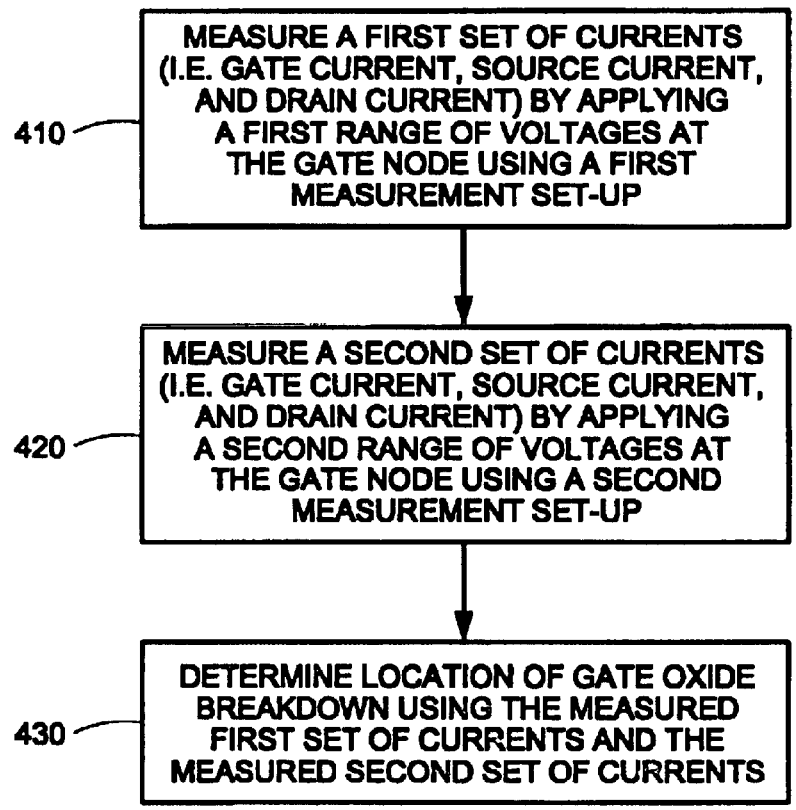
FIG. 4 illustrates a flow chart showing a method of determining a location of a breakdown in a gate oxide of a MOSFET in accordance with an embodiment of the present invention.

FIG. 4 illustrates a flow chart showing a method 400 of determining a location of a breakdown in a gate oxide of a MOSFET in accordance with an embodiment of the present invention The method 400 is applicable to both NMOSFETs and PMOSFETs.

At Block 410, the MOSFET is configured according to a first measurement set-up. In the case of an NMOSFET, the source node of the NMOSFET is coupled to a ground, while the drain node of the NMOSFET is coupled to a first voltage such as 1.5 V. A first range of voltages is applied at the gate node of the MOSFET. For each applied voltage, a first set of currents is measured, whereas the first set of currents include a gate current, a source current, and a drain current.

At Block 420, the MOSFET is configured according to a second measurement set-up. In the case of an NMOSFET, the source node of the NMOSFET is coupled to the first voltage such as 1.5 V, while the drain node of the NMOSFET is coupled to the ground. A second range of voltages is applied at the gate node of the MOSFET. For each applied voltage, a second set of currents is measured, whereas the first set of currents include a gate current, a source current measured at the drain node, and a drain current measured at the source node.

Furthermore, at Block 430, the location (e.g., in a source node overlap portion of the gate oxide, in a drain node overlap portion of the gate oxide, or in a channel portion of the gate oxide 60) of the breakdown of the gate oxide 60 of the NMOSFET device 100 is determined using the measured first set of currents and the measured second set of currents. Plots (see FIGS. 2B–2D) of the measured first set of currents and the measured second set of currents indicate whether there is a breakdown in the gate oxide. Moreover, the plots (see FIGS. 2B–2D) of the measured first set of currents and the measured second set of currents indicate whether the breakdown is located in a channel portion of the gate oxide, in a source node overlap portion of the gate oxide, or in a drain node overlap portion of the gate oxide. It should be understood that Block 420 (measuring the second set of currents) can be omitted since Block 420 (measuring the second set of currents) is performed to confirm the result of Block 410 (measuring the first set of currents).

The foregoing descriptions of specific embodiments of the present invention have been presented for purposes of illustration and description. They are not intended to be exhaustive or to limit the invention to the precise forms disclosed, and many modifications and variations are possible in light of the above teaching The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of determining a location of a breakdown in a gate oxide of a MOSFET (metal oxide semiconductor field effect transistor), comprising:
    a) configuring said MOSFET according to a measurement set-up, wherein said measurement set-up includes coupling a source node of said MOSFET to one of a ground and a first voltage and coupling a drain node of said MOSFET to one of said ground and said first voltage;
    b) applying a range of voltages at a gate node of said MOSFET;
    c) for each applied voltage, measuring a first set of currents, wherein said currents include a gate current, a source current, and a drain current; and
    d) determining said location of said breakdown using said measured first set of currents.

2. A method as recited in claim 1 wherein said location is in a channel portion of said gate oxide if said gate current is larger relative to a normal gate current at said applied voltages.

3. A method as recited in claim 1 wherein said location is in a source node overlap portion of said gate oxide if said source current is larger relative to a normal source current at negative applied voltages.

4. A method as recited in claim 1 wherein said location is in a drain node overlap portion of said gate oxide if said drain current is larger relative to a normal drain current at negative applied voltages.

5. A method as recited in claim 1 wherein said MOSFET comprises a NMOSFET (n-type metal oxide semiconductor field effect transistor).

6. A method as recited in claim 1 wherein said MOSFET comprises a PMOSFET (p-type metal oxide semiconductor field effect transistor).

7. A method as recited in claim 1 wherein said range of voltages includes negative voltages and positive voltages.

8. A method as recited in claim 1 wherein thickness of said gate oxide is no less than approximately 3 nanometers.

9. A method as recited in claim 1 wherein thickness of said gate oxide is no greater than approximately 3 nanometers.

10. A method as recited in claim 1 wherein said source node is coupled to said ground, and wherein said drain node is coupled to said first voltage.

11. A method as recited in claim 1 wherein said source node is coupled to said first voltage, and wherein said drain node is coupled to said ground.

12. A method of determining a location of a breakdown in a gate oxide of a MOSFET (metal oxide semiconductor field effect transistor), comprising:
    a) applying a first range of voltages at a gate node of said MOSFET configured according to a first measurement set-up and measuring a first set of currents of said MOSFET at each applied first range of voltages, wherein in said first measurement set-up said currents include a gate current, a source current measured at a source node of said MOSFET, and a drain current measured at a drain node of said MOSFET, and wherein said first measurement set-up includes coupling said source node to one of a around and a first voltage and coupling said drain node to one of said ground and said first voltage;
    b) applying a second range of voltages at said gate node of said MOSFET configured according to a second measurement set-up and measuring a second set of currents of said MOSFET at each applied second range of voltages, wherein in said second measurement set-up said currents include said gate current, said source current measured at said drain node, and said drain current measured at said source node, and wherein said second measurement set-up includes coupling said source node to one of said ground and said first voltage and coupling said drain node to one of said ground and said first voltage; and c) determining said location of said breakdown using said measured first set of currents and said measured second set of currents.

13. A method as recited in claim 12 wherein said location is in a channel portion of said gate oxide if said gate current of said first and second sets of currents are larger relative to a normal gate current at said applied voltages.

14. A method as recited in claim 12 wherein said location is in a source node overlap portion of said gate oxide if said source current of said first set of currents is larger relative to a normal source current at negative applied voltages, and if said drain current of said second set of currents is larger relative to a normal drain current at negative applied voltages.

15. A method as recited in claim 12 wherein said location is in a drain node overlap portion of said gate oxide if said drain current of said first set of currents is larger relative to a normal drain current at negative applied voltages, and if said source current of said second set of currents is larger relative to a normal source current at negative applied voltages.

16. A method as recited in claim 12 wherein said MOSFET comprises a NMOSFET (n-type metal oxide semiconductor field effect transistor).

17. A method as recited in claim 12 wherein said MOSFET comprises a PMOSFET (p-type metal oxide semiconductor field effect transistor).

18. A method as recited in claim 12 wherein each of said first and second ranges of voltages includes negative voltages and positive voltages.

19. A method as recited in claim 12 wherein thickness of said gate oxide is no less than approximately 3 nanometers.

20. A method as recited in claim 12 wherein thickness of said gate oxide is no greater than approximately 3 nanometers.

21. A method as recited in claim 12 wherein in said first measurement set-up said MOSFET has said source node coupled to said ground and said drain node coupled to said first voltage.

22. A method as recited in claim 12 wherein in said second measurement set-up said MOSFET has said source node coupled to said first voltage and said drain node coupled to said ground.

23. A method of determining a location of a breakdown in a gate oxide of a MOSFET (metal oxide semiconductor field effect transistor), comprising:

a) configuring said MOSFET according to a measurement set-up, wherein said measurement set-up includes coupling a source node of said MOSFET to one of a ground and a first voltage and coupling a drain node of said MOSFET to one of said ground and said first voltage;

b) applying a range of voltages at a gate node of said MOSFET;

c) for each applied voltage, measuring a first set of currents, wherein said currents include a gate current, a source current, and a drain current; and d) determining said location of said breakdown by comparing said measured first set of currents with a set of normal currents for said gate current, said source current, and said drain current.

24. A method as recited in claim 23 wherein said location is in a channel portion of said gate oxide if said gate current is larger relative to a normal gate current at said applied voltages.

25. A method as recited in claim 23 wherein said location is in a source node overlap portion of said gate oxide if said source current is larger relative to a normal source current at negative applied voltages.

26. A method as recited in claim 23 wherein said location is in a drain node overlap portion of said gate oxide if said drain current is larger relative to a normal drain current at negative applied voltages.

27. A method as recited in claim 23 wherein said MOSFET comprises a NMOSFET (n-type metal oxide semiconductor field effect transistor).

28. A method as recited in claim 23 wherein said MOSFET comprises a PMOSFET (p-type metal oxide semiconductor field effect transistor).

29. A method as recited in claim 23 wherein said range of voltages includes negative voltages and positive voltages.

30. A method as recited in claim 23 wherein thickness of said gate oxide is no less than approximately 3 nanometers.

31. A method as recited in claim 23 wherein thickness of said gate oxide is no greater than approximately 3 nanometers.

32. A method as recited in claim 23 wherein said source node is coupled to said ground, and wherein said drain node is coupled to said first voltage.

33. A Method as recited in claim 23 wherein said source node is coupled to said first voltage, and wherein said drain node is coupled to said ground.

* * * * *